United States Patent
Li

(10) Patent No.: US 9,520,955 B2
(45) Date of Patent: Dec. 13, 2016

(54) DETECTION APPARATUS AND DETECTION METHOD FOR RECEIVED SIGNAL STRENGTH INDICATOR

(71) Applicant: Huawei Technologies Co., Ltd., Shenzhen (CN)

(72) Inventor: Hai Li, Chengdu (CN)

(73) Assignee: Huawei Technologies Co, Ltd., Shenzhen (CN)

(*) Notice: Subject to any disclaimer, the term of this patent is extended or adjusted under 35 U.S.C. 154(b) by 0 days.

(21) Appl. No.: 14/732,245

(22) Filed: Jun. 5, 2015

(65) Prior Publication Data
US 2015/0270913 A1    Sep. 24, 2015

Related U.S. Application Data

(63) Continuation of application No. PCT/CN2012/086038, filed on Dec. 6, 2012.

(51) Int. Cl.
H04B 17/00       (2015.01)
H04B 17/318     (2015.01)
(Continued)

(52) U.S. Cl.
CPC .......... H04B 17/318 (2015.01); H03G 3/3052 (2013.01); H03G 3/3078 (2013.01); H04L 27/2039 (2013.01); H04W 52/245 (2013.01)

(58) Field of Classification Search
CPC .... H03G 3/002; H03G 3/3005; H03G 3/3068; H03G 3/3078; H03G 3/3089; H04B 17/318; H04L 27/2039
(Continued)

(56) References Cited

U.S. PATENT DOCUMENTS

| | | | |
|---|---|---|---|
| 6,944,427 B2* | 9/2005 | Haub | H04B 1/109 455/295 |
| 7,072,632 B2* | 7/2006 | Astrachan | H04B 17/318 455/226.2 |

(Continued)

FOREIGN PATENT DOCUMENTS

| | | |
|---|---|---|
| CN | 101132183 A | 2/2008 |
| CN | 101296004 A | 10/2008 |

(Continued)

*Primary Examiner* — Simon Nguyen
(74) *Attorney, Agent, or Firm* — Slater Matsil, LLP

(57) ABSTRACT

Embodiments of the present invention provide a detection method including receiving a modulated signal data stream from a microwave transmit end, performing amplification on the modulated signal data stream according to an amplification control signal, where the amplification control signal is used to indicate the number of amplification times for the amplification performed on the modulated signal data stream, performing analog-to-digital conversion on the amplified modulated signal data stream to obtain a first digital signal data stream; filtering the first digital signal data stream, performing power detection on the first digital signal data stream to obtain a first average power value, performing power detection on a filtered first digital signal data stream to obtain a second average power value, obtaining the amplification control signal according to the first average power value, and obtaining an RSSI value by calculation according to the amplification control signal and the second average power value.

11 Claims, 2 Drawing Sheets

(51) Int. Cl.
*H04L 27/20* (2006.01)
*H04W 52/24* (2009.01)
*H03G 3/30* (2006.01)

(58) Field of Classification Search
USPC ............................... 455/226.1–226.2, 226.4
See application file for complete search history.

(56) References Cited

U.S. PATENT DOCUMENTS

| | | | | |
|---|---|---|---|---|
| 7,151,759 | B1* | 12/2006 | Ryan | H03G 3/3078 370/328 |
| 7,212,798 | B1 | 5/2007 | Adams et al. | |
| 7,245,893 | B1* | 7/2007 | Husted | H03G 3/3068 375/345 |
| 8,693,968 | B2* | 4/2014 | Beamish | H03J 7/02 455/226.1 |
| 2003/0078007 | A1* | 4/2003 | Parssinen | H03G 3/3068 455/67.11 |
| 2004/0097209 | A1* | 5/2004 | Haub | H03G 3/001 455/242.1 |
| 2005/0079841 | A1 | 4/2005 | Astrachan et al. | |
| 2005/0287974 | A1 | 12/2005 | Zhou | |
| 2006/0025081 | A1* | 2/2006 | Zolfaghari | H04B 1/40 455/69 |
| 2008/0051050 | A1 | 2/2008 | Kim et al. | |
| 2009/0233566 | A1 | 9/2009 | Li et al. | |
| 2010/0046679 | A1* | 2/2010 | Kajakine | H03G 3/3068 375/345 |
| 2011/0255642 | A1* | 10/2011 | Nagai | H03G 3/3068 375/345 |
| 2013/0324065 | A1 | 12/2013 | Qin et al. | |

FOREIGN PATENT DOCUMENTS

| | | |
|---|---|---|
| CN | 101534131 A | 9/2009 |
| CN | 202334449 U | 7/2012 |
| JP | 2006165677 A | 6/2006 |
| WO | 2011100920 A2 | 8/2011 |

* cited by examiner

DETECTION APPARATUS AND DETECTION METHOD FOR RECEIVED SIGNAL STRENGTH INDICATOR

This application is a continuation application of International Application No. PCT/CN2012/086038, filed on Dec. 6, 2012, which is hereby incorporated by reference in its entirety.

TECHNICAL FIELD

The present invention relates to the microwave field, and in particular, to a detection apparatus and a detection method for a received signal strength indicator.

BACKGROUND

A received signal power indicator (RSSI) function is an important function of a receiver in a microwave system. The RSSI function provides a real-time received signal power indicator and provides fundamental data input for a part of functions in the microwave system, for example, a determining function of determining, during network construction, whether a microwave device is correctly installed. There is an extremely high requirement on both accuracy and realtimeness of an RSSI. Accuracy of an RSSI is primarily reflected by whether a fluctuation range of an indicated RSSI indicator meets a requirement in a situation in which input power is stable, and realtimeness of an RSSI is primarily reflected by whether a result indicated by the RSSI can track and reflect a change of adjustment when power of an external input signal regularly fluctuates, for example, when strength of a signal is adjusted at a speed of 100 dB/s.

An adaptive bandwidth switching function needs to be supported in the microwave system. The adaptive bandwidth switching function means that, when rapid fading occurs in a spatial transmission process of a microwave, for example, phenomena such as an unexpected rain or fog may cause rapid fading of a transmission channel of the microwave, a reflection of which in a signal is a rapid drop of receive power at a receive end. In a narrowband system, a data stream has a low transmission speed and occupies a narrow transmission channel, while in a wideband system, a data stream has a high transmission speed and occupies a wide transmission channel. By using a characteristic that sensitivity of a narrowband system is higher than that of a wideband system, data stream bandwidth is switched from wideband to narrowband, thereby ensuring stable functioning of data with a high priority, where the data stream bandwidth refers to a manifestation of a rate of a data stream in the frequency domain, for example, data stream bandwidth of a data stream whose rate is 1 Mbit/s is 1 MHz.

In the prior art, an amplification unit performs amplification on a received data stream; an analog-to-digital conversion unit performs analog-to-digital conversion on an amplified data stream to obtain a digital data stream; a filter with constant filtering bandwidth is used to filter the digital data stream; a power detection module is used to perform power detection on a filtered digital data stream; an amplification control signal of the amplification unit is obtained according to detected power; and an RSSI value is obtained according to the amplification control signal, the detected power, and a relationship between filtering bandwidth and bandwidth of the digital data stream. A function of an amplification control signal is to perform amplification control on a data stream received by a receiver, and an amplification function needs to ensure stability of a filtered digital data stream. When signal bandwidth of the microwave system is switched, the amplification control signal transits. For example, total power of 100 M bandwidth at an analog-to-digital conversion unit is 1 W; filtering bandwidth is 10 M; actual bandwidth that can be detected by power detection is only 10 M, which is a tenth of 100 M; and at this time, power detected by power detection is 0.1 W. When the bandwidth is switched to 50 M and the power is still 1 W and the filtering bandwidth is still 10 M, power that can be detected by power detection becomes 0.2 W, and an amplification control signal obtained according to the power value transits until detected power is 0.1 W. At this time, actual power of 50 M bandwidth decreases to 0.5 W, while 0.5 W power affects operating of the analog-to-digital conversion unit, causing bit errors.

SUMMARY

In view of the foregoing problem, embodiments of the present invention provide an RSSI detection apparatus and an RSSI detection method, aiming to resolve a technical problem that in an RSSI detection method of the prior art, an amplification control signal transits during bandwidth switching, which causes a transition of power of an analog-to-digital conversion unit in receiving a data stream, and further causes bit errors.

According to a first aspect, the RSSI detection apparatus is located at a microwave receive end, and includes an amplification unit, an analog-to-digital conversion unit, a filtering unit, a first power detection unit, a second power detection unit, an amplification control unit, and an RSSI calculation unit, where the amplification unit is configured to: receive a modulated signal data stream from a microwave transmit end, perform amplification on the modulated signal data stream according to an amplification control signal, and send the amplified modulated signal data stream to the analog-to-digital conversion unit, where the amplification control signal is used to indicate the number of amplification times for the amplification performed by the amplification unit on the modulated signal data stream; the analog-to-digital conversion unit is configured to: perform analog-to-digital conversion on the amplified modulated signal data stream to obtain a first digital signal data stream, and send the first digital signal data stream to the filtering unit and the first power detection unit; the filtering unit is configured to: filter the first digital signal data stream, and send a filtered first digital signal data stream to the second power detection unit; the first power detection unit is configured to: perform power detection on the first digital signal data stream to obtain a first average power value, and send the first average power value to the amplification control unit; the second power detection unit is configured to: perform power detection on the filtered first digital signal data stream to obtain a second average power value, and send the second average power value to the RSSI calculation unit; the amplification control unit is configured to: obtain the amplification control signal according to the first average power value, and send the amplification control signal to the RSSI calculation unit and the amplification unit; and the RSSI calculation unit is configured to obtain an RSSI value by calculation according to the amplification control signal and the second average power value.

In a first possible implementation manner of the first aspect, bandwidth of a filtering channel of the filtering unit is the same as bandwidth of the first digital signal data stream.

In a second possible implementation manner of the first aspect, bandwidth of a filtering channel of the filtering unit is less than bandwidth of the first digital signal data stream.

With reference to the second possible implementation manner of the first aspect, in a third possible implementation manner, the RSSI calculation unit is specifically configured to: perform correction on the second average power value according to a difference between the bandwidth of the first digital signal data stream and the bandwidth of the filtering channel, and obtain the RSSI value by calculation according to the amplification control signal and a corrected second average power value.

With reference to the first possible implementation manner of the first aspect, in a fourth possible implementation manner, the apparatus further includes: a bandwidth information extraction unit, configured to acquire, from the first digital signal data stream, information that the bandwidth of the first digital signal data stream is going to change after a time T, and notify a delay alignment unit; and the delay alignment unit, configured to: calculate a switching time t, and at a moment when the switching time t expires, instruct the filtering unit to perform switching on the bandwidth of the filtering channel, where t=t1−t2, t1 is a delay from digital-to-analog conversion to acquisition of information from the first digital signal data stream, and t2 is a delay from digital-to-analog conversion to filtering.

With reference to the fourth possible implementation manner of the first aspect, in a fifth possible implementation manner, the filtering unit is a digital filter bank, and the switching performed by the filtering unit on the bandwidth of the filtering channel is completed by adjusting a coefficient of the digital filter bank.

According to a second aspect, the RSSI detection method includes: receiving a modulated signal data stream from a microwave transmit end, and performing amplification on the modulated signal data stream according to an amplification control signal, where the amplification control signal is used to indicate the number of amplification times for the amplification performed on the modulated signal data stream; performing analog-to-digital conversion on the amplified modulated signal data stream to obtain a first digital signal data stream; filtering the first digital signal data stream; performing power detection on the first digital signal data stream to obtain a first average power value; performing power detection on a filtered first digital signal data stream to obtain a second average power value; obtaining the amplification control signal according to the first average power value; and obtaining an RSSI value by calculation according to the amplification control signal and the second average power value.

In a first possible implementation manner of the second aspect, the filtering the first digital signal data stream specifically includes: performing bandwidth-matched filtering on the first digital signal data stream, where bandwidth of the first digital signal data stream is the same as bandwidth of a filtering channel.

In a second possible implementation manner of the second aspect, the filtering the first digital signal data stream specifically includes: performing bandwidth-unmatched filtering on the first digital signal data stream, where bandwidth of the first digital signal data stream is greater than bandwidth of a filtering channel.

With reference to the second possible implementation manner of the second aspect, in a third possible implementation manner, the obtaining an RSSI value by calculation according to the amplification control signal and the second average power value specifically includes: performing correction on the second average power value according to a difference between the bandwidth of the first digital signal data stream and the bandwidth of the filtering channel; and obtaining the RSSI value by calculation according to the amplification control signal and a corrected second average power value.

With reference to the first possible implementation manner of the second aspect, in a fourth possible implementation manner, the performing bandwidth-matched filtering on the first digital signal data stream specifically includes: acquiring, from the first digital signal data stream, information that the bandwidth of the first digital signal data stream is going to change after a time T, calculating a switching time t, and at a moment when the switching time t expires, performing switching on the bandwidth of the filtering channel, where t=t1−t2, t1 is a delay from digital-to-analog conversion to acquisition of information from the first digital signal data stream, and t2 is a delay from digital-to-analog conversion to filtering; and performing the bandwidth-matched filtering on the first digital signal data stream by using a switch-to filtering channel.

In the embodiments of the present invention, an amplification unit receives a modulated signal data stream from a microwave transmit end and performs amplification on the modulated signal data stream according to an amplification control signal; an analog-to-digital conversion unit performs analog-to-digital conversion on the amplified modulated signal data stream to obtain a first digital signal data stream; a first power detection unit performs power detection on the first digital signal data stream to obtain a first average power value; and an amplification control unit obtains the amplification control signal according to the first average power value. In the embodiments, power detection required for an RSSI is separated from power detection required for amplification control, and power detection is performed directly on the first digital signal data stream; before that, filtering processing is not performed, that is, power detection is performed on all bandwidth of the first digital signal data stream; therefore, even if bandwidth switching occurs, the amplification control signal will not transit, which ensures power stability of a data stream that enters the analog-to-digital conversion unit, thereby reducing the possibility of bit errors and ensuring correct receipt of a service.

DETAILED DESCRIPTION OF ILLUSTRATIVE EMBODIMENTS

To make the objectives, technical solutions, and advantages of the present invention clearer and more comprehensible, the following further describes the present invention in detail with reference to the accompanying drawings and embodiments. It should be understood that the specific embodiments described herein are merely used to explain the present invention but are not intended to limit the present invention.

In order to describe the technical solutions of the present invention, specific embodiments are used in the following description.

Embodiment 1

Figure 1:
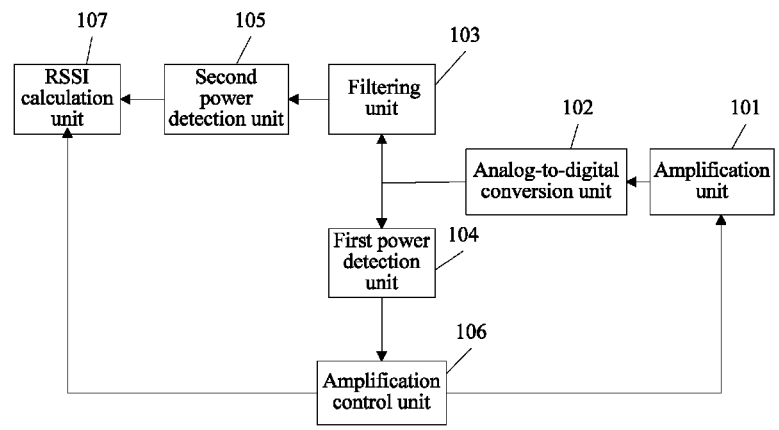
FIG. 1 is a structural diagram of an RSSI detection apparatus according to a first embodiment of the present invention.

FIG. 1 shows a structure of an RSSI detection apparatus provided in a first embodiment of the present invention, where the detection apparatus is located at a microwave receive end. The detection apparatus in this embodiment includes: an amplification unit 101, an analog-to-digital conversion unit 102, a filtering unit 103, a first power detection unit 104, a second power detection unit 105, an amplification control unit 106, and an RSSI calculation unit 107.

The amplification unit 101 is configured to: receive a modulated signal data stream from a microwave transmit end, perform amplification on the modulated signal data stream according to an amplification control signal, and send the amplified modulated signal data stream to the analog-to-digital conversion unit 102, where the amplification control signal is used to indicate the number of amplification times for the amplification performed by the amplification unit on the modulated signal data stream.

In this embodiment, the amplification unit may be a VGA (voltage-controlled gain amplifier), where the VGA is a device for a gain of a voltage-controlled device and has two inputs, of which one is a signal input, that is, the modulated signal data stream from the microwave transmit end, and the other is a control voltage input. The modulated signal data stream enters the analog-to-digital conversion unit 102 after being amplified by the VGA.

In this embodiment, the microwave transmit end is briefly described. A digital modem chip at the microwave transmit end performs framing on a transmitted data stream, where the framing refers to splitting up a bit stream, all of which is valid information, according to a fixed length, inserting header information into a header of each frame, and inserting redundancy information such as bandwidth switching information to ensure channel stability. After framed data is modulated, a digital signal is converted into an analog signal in a digital-to-analog conversion unit, and the signal enters the analog domain. In the analog domain, the signal is a modulated signal, that is, a signal that has been modulated. A frequency channel output by a digital modem chip is a frequency channel whose center frequency is low, and cannot be directly used for sending. It is required to convert, in a frequency mixing manner, a frequency of the signal to a frequency at which the signal can be transferred through space. After frequency conversion and amplification are performed by a sending channel, the modulated signal at the microwave transmit end is sent to the microwave receive end.

In this embodiment, a receiving channel at the microwave receive end changes a frequency of the input modulated signal to a frequency channel on which a digital modem can receive the signal, and then the input modulated signal is sent to the amplification unit 101.

The analog-to-digital conversion unit 102 is configured to: perform analog-to-digital conversion on the amplified modulated signal data stream to obtain a first digital signal data stream, and send the first digital signal data stream to the filtering unit 103 and the first power detection unit 104.

In this embodiment, the analog-to-digital conversion unit 102 is a common high-speed ADC (analog-to-digital conversion) module in a microwave system. Power of the amplified modulated signal data stream determines a bit error rate of analog-to-digital conversion, and a power transition of the modulated signal data stream is likely to cause occurrence of a bit error.

The filtering unit 103 is configured to: filter the first digital signal data stream, and send a filtered first digital signal data stream to the second power detection unit 105.

In this embodiment, bandwidth of a filtering channel of the filtering unit 103 is less than bandwidth of the first digital signal data stream, and the bandwidth of the filtering channel of the filtering unit 103 is fixed.

In another embodiment, the bandwidth of the filtering channel of the filtering unit 103 may remain consistent with the bandwidth of the first digital signal data stream. When the bandwidth of the first digital signal data stream changes, the bandwidth of the filtering channel of the filtering unit 103 also changes accordingly.

The first power detection unit 104 is configured to: perform power detection on the first digital signal data stream to obtain a first average power value, and send the first average power value to the amplification control unit 106.

In this embodiment, power detection is performed by using a number obtained after data of the data stream is digitalized. For example, sampling is performed by using an 8-bit ADC module. It is assumed that maximum input power of the ADC is 1 W, and a signal of 0-1 W is quantized to 0-255, where an input of 0 W is corresponding to 0, and an input of 1 W is corresponding to 255. Then, signal power before sampling can be mapped to power of the first power detection unit in such a one-to-one manner. A function of the first power detection unit is to perform root-mean-square accumulation and averaging processing on data of an input data stream and acquire a first average power value of the data stream. The first power detection unit sends the first average power value to the amplification control unit.

The second power detection unit 105 is configured to: perform power detection on the filtered first digital signal data stream to obtain a second average power value, and send the second average power value to the RSSI calculation unit 107.

In this embodiment, a function of the second power detection unit is to perform root-mean-square accumulation and averaging processing on the data of the input data stream and acquire a second average power value of the data stream. The second power detection unit sends the second average power value to the RSSI calculation unit.

The amplification control unit 106 is configured to: obtain the amplification control signal according to the first average power value, and send the amplification control signal to the RSSI calculation unit 107 and the amplification unit 101.

In this embodiment, the amplification control unit is a VGA control unit, which outputs, by determining the first average power value, a control word that reflects a change of a control voltage by using a difference of a clock duty cycle. A low-pass filter may be used to change the control word represented by the clock duty cycle into an actual control voltage and send the actual control voltage to the VGA, and finally a digital AGC (automatic gain control) control function is fulfilled. The low-pass filter is an analog low-pass filter implemented by a capacitor and a resistor.

In this embodiment, the control word represented by the clock duty cycle may be directly sent to the RSSI calculation unit.

The RSSI calculation unit 107 is configured to obtain an RSSI value by calculation according to the amplification control signal and the second average power value.

In this embodiment, the RSSI calculation unit receives the amplification control signal from the amplification control unit 106 and the second average power value from the second power detection unit, performs correction on the second average power value according to a difference between the bandwidth of the first digital signal data stream and the bandwidth of the filtering channel, and obtains the RSSI value by calculation according to the amplification control signal and a corrected second average power value.

In this embodiment, it is assumed that the bandwidth of the first digital signal data stream is 100 M, that the bandwidth of the filtering channel of the filtering unit 103 is 10 M, and that the second average power value is 0.1 W. Then, the second average power value may be corrected to 1 W. It is assumed that the number of amplification times, indicated by the amplification control signal to the amplification unit, is 2, and then it can be obtained that the RSSI value is 0.5 W.

In this embodiment, an amplification unit receives a modulated signal data stream from a microwave transmit end and performs amplification on the modulated signal data stream according to an amplification control signal; an analog-to-digital conversion unit performs analog-to-digital conversion on the amplified modulated signal data stream to obtain a first digital signal data stream; a first power detection unit performs power detection on the first digital signal data stream to obtain a first average power value; and an amplification control unit obtains the amplification control signal according to the first average power value. In this embodiment, power detection required for an RSSI is separated from power detection required for amplification control, and power detection is performed directly on the first digital signal data stream; before that, filtering processing is not performed, that is, power detection is performed on all bandwidth of the first digital signal data stream; therefore, even if bandwidth switching occurs, the amplification control signal will not transit, which ensures power stability of a data stream that enters the analog-to-digital conversion unit, thereby reducing the possibility of bit errors and ensuring correct receipt of a service.

Embodiment 2

Figure 2:
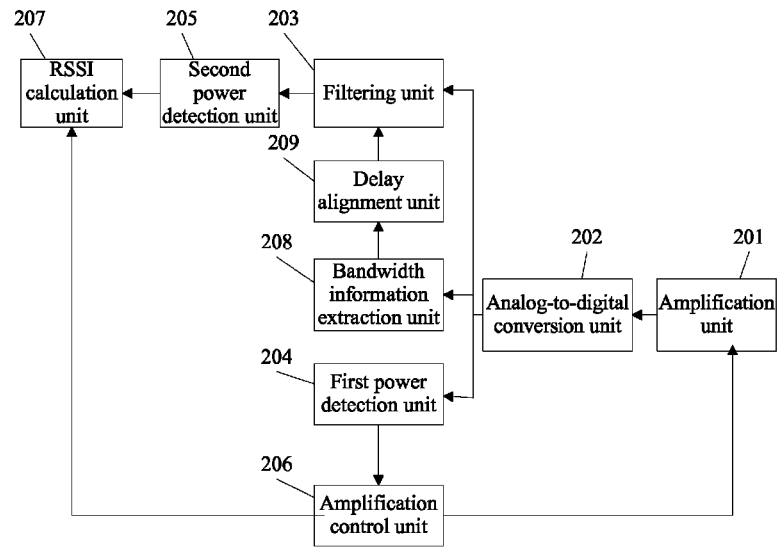
FIG. 2 is a structural diagram of an RSSI detection apparatus according to a second embodiment of the present invention.

FIG. 2 shows a structure of an RSSI detection apparatus provided in a second embodiment of the present invention, where the detection apparatus is located at a microwave receive end. The detection apparatus in this embodiment includes: an amplification unit 201, an analog-to-digital conversion unit 202, a filtering unit 203, a first power detection unit 204, a second power detection unit 205, an amplification control unit 206, an RSSI calculation unit 207, a bandwidth information extraction unit 208, and a delay alignment unit 209.

The amplification unit 201 is configured to: receive a modulated signal data stream from a microwave transmit end, perform amplification on the modulated signal data stream according to an amplification control signal, and send the amplified modulated signal data stream to the analog-to-digital conversion unit 202, where the amplification control signal is used to indicate the number of amplification times for the amplification performed by the amplification unit on the modulated signal data stream.

In this embodiment, the amplification unit may be a VGA, where the VGA is a device for a gain of a voltage-controlled device and has two inputs, of which one is a signal input, that is, the modulated signal data stream from the microwave transmit end, and the other is a control voltage input. The modulated signal data stream enters the analog-to-digital conversion unit 202 after being amplified by the VGA.

In this embodiment, a receiving channel at the microwave receive end changes a frequency of the input modulated signal to a frequency channel on which a digital modem can receive the signal, and then the input modulated signal is sent to the amplification unit 201.

The analog-to-digital conversion unit 202 is configured to: perform analog-to-digital conversion on the amplified modulated signal data stream to obtain a first digital signal data stream, and send the first digital signal data stream to the filtering unit 203, the first power detection unit 204, and the bandwidth information extraction unit 208.

In this embodiment, the analog-to-digital conversion unit 202 is a common high-speed ADC (analog-to-digital conversion) module in a microwave system. Power of the amplified modulated signal data stream determines a bit error rate of analog-to-digital conversion, and a power transition of the modulated signal data stream is likely to cause occurrence of a bit error.

The filtering unit 203 is configured to: filter the first digital signal data stream, and send a filtered first digital signal data stream to the second power detection unit 205.

In this embodiment, bandwidth of a filtering channel of the filtering unit 203 remains consistent with bandwidth of the first digital signal data stream. When the bandwidth of the first digital signal data stream changes, the bandwidth of the filtering channel of the filtering unit 203 also changes accordingly.

In this embodiment, the filtering unit 203 is a digital filter bank and can complete an adjustment of filter passband bandwidth by adjusting a filter coefficient in real time, where the filter passband bandwidth refers to bandwidth that allows a signal to pass through a filter without a power loss, that is, the bandwidth of the filtering channel of the filtering unit 203. For example, when a bandwidth adjustment occurs, if bandwidth of a data stream at the transmit end is adjusted from 100 MHz to 50 MHz, the filter passband bandwidth of the filter bank may be adjusted from 100 MHz to 50 MHz by adjusting a coefficient of the filter bank module, so as to implement that the bandwidth of the filtering channel of the filtering unit 203 is the same as the bandwidth of the first digital signal data stream.

If the bandwidth of the filtering channel of the filtering unit is less than the bandwidth of the first digital signal data stream, the second power detection unit 205 can only acquire a part of power of the first digital signal data stream, where the power is reflected in an RSSI detection result by compensating according to a proportion of actual signal bandwidth to signal bandwidth after a filter, and in a situation in which signal distortion appears in a transmission channel in a frequency band for the filter to collect a signal, an error is brought about and finally reflected in RSSI detection. RSSI indicator precision is of great importance to network planning and on-site installation of a product. Higher RSSI indicator precision brings about higher accuracy of network planning and a smaller margin reserved to withstand signal fading of the transmission channel. For example, if RSSI indicator precision of a receiver is +/−3 dB and a spatial fading reserve is 35 dB, the RSSI indicator precision of −3 dB needs to be taken into account in designing a fading reserve, and then 38 dB needs to be reserved as the fading reserve because during actual installation, an error of the RSSI indicator precision may be −3 dB, and as a result, a planned maximum transmission distance at which installation can be performed is reduced.

An error brought about by only extracting a part of power of the data stream during the RSSI detection is avoided in this embodiment.

The first power detection unit 204 is configured to: perform power detection on the first digital signal data stream to obtain a first average power value, and send the first average power value to the amplification control unit 206.

In this embodiment, power detection is performed by using a number obtained after data of the data stream is digitalized. For example, sampling is performed by using an 8-bit ADC module. It is assumed that maximum input power of the ADC is 1 W, and a signal of 0-1 W is quantized to 0-255, where an input of 0 W is corresponding to 0, and an input of 1 W is corresponding to 255. Then, signal power before sampling can be mapped to power of the first power detection unit in such a one-to-one manner. A function of the first power detection unit is to perform root-mean-square accumulation and averaging processing on data of an input data stream and acquire a first average power value of the data stream. The first power detection unit sends the first average power value to the amplification control unit.

The second power detection unit 205 is configured to: perform power detection on the filtered first digital signal data stream to obtain a second average power value, and send the second average power value to the RSSI calculation unit 207.

In this embodiment, a function of the second power detection unit is to perform root-mean-square accumulation and averaging processing on the data of the input data stream and acquire a second average power value of the data stream. The second power detection unit sends the second average power value to the RSSI calculation unit.

The amplification control unit 206 is configured to: obtain the amplification control signal according to the first average power value, and send the amplification control signal to the RSSI calculation unit 207 and the amplification unit 201.

In this embodiment, the amplification control unit is a VGA control unit, which outputs, by determining the first average power value, a control word that reflects a change of a control voltage by a difference of a clock duty cycle. A low-pass filter may be used to change the control word represented by the clock duty cycle into an actual control voltage and send the actual control voltage to the VGA, and finally a digital AGC (automatic gain control) control function is fulfilled. The low-pass filter is an analog low-pass filter implemented by a capacitor and a resistor.

In this embodiment, the control word represented by the clock duty cycle may be directly sent to the RSSI calculation unit.

The bandwidth information extraction unit 208 is configured to acquire, from the first digital signal data stream, information that the bandwidth of the first digital signal data stream is going to change after a time T, and notify the delay alignment unit.

In this embodiment, it is assumed that before bandwidth switching, time of a frame period of received microwave frames is t4, and that the bandwidth information extraction unit extracts a penultimate frame from the microwave frames before the switching, and then it can be learned that the bandwidth is going to change at time 2*t4, where the microwave transmit end may add a mark in the microwave frames so that the bandwidth information extraction unit can identify the penultimate frame from the microwave frames before the switching. Generally, a delay from digital-to-analog conversion to acquisition of information from the first digital signal data stream is greater than a delay from digital-to-analog conversion to filtering, and therefore, the filter needs to be switched in advance, so that the filtering channel of the filtering unit 203 completes the bandwidth switching of the filtering channel exactly when the first frame of the first digital signal data stream after switching arrives at the filtering 203; and otherwise, a transition of the RSSI detection result may be caused.

The transition of the RSSI detection result causes a problem during coordination with an ATPC function, where the ATPC function means: a receive end of a microwave device sets target power, and the receive end compares the target power with power indicated by an actually detected RSSI; and if the indicated power changes, the receive end sends a power adjustment request to the transmit end to make the transmit end adjust transmit power. If an RSSI indicator transits, the transmit end makes a corresponding adjustment. When output power of the transmit end increases, receive power increases accordingly, which may trigger bandwidth switching again. Therefore, a situation in which bandwidth is repeatedly switched is likely to appear, and repeated bandwidth switching is unacceptable for a user.

The delay alignment unit 209 is configured to: calculate a switching time t, and at a moment when the switching time t expires, perform switching on the bandwidth of the filtering channel, where $t=t1-t2$, t1 is a delay from digital-to-analog conversion to acquisition of information from the first digital signal data stream, and t2 is a delay from digital-to-analog conversion to filtering.

In this embodiment, if t4 is less than (t1−t2) and 2*t4 is greater than (t1−t2), it indicates that at time (2*t4−t1+t2) after the bandwidth information extraction unit extracts the penultimate frame from the microwave frames before the switching, the delay alignment unit needs to perform switching on the bandwidth of the filtering channel.

In this embodiment, if t4 is greater than t1−t2, it indicates that at time (t4−t1+t2) after the bandwidth information extraction unit extracts the last frame from the microwave frames before the switching, the delay alignment unit needs to perform switching on the bandwidth of the filtering channel.

In this embodiment, the filter passband bandwidth of the digital filter bank is adjusted to be the same as corresponding data stream bandwidth, and signal bandwidth, before passing through the RSSI calculation unit, of the second power detection unit is bandwidth of a whole useful signal. For example, filter bandwidth of the filter bank module through which a data stream whose power is 1 W and whose bandwidth is 100 M passes is 100 M, and power detected by the power detection module is 1 W; after bandwidth switching occurs, filter bandwidth of the filter bank module through which a data stream whose power is 1 W and whose bandwidth is 50 M passes is 50 M, and power detected by the power detection module is still 1 W. The bandwidth of the filtering channel of the filtering unit is switched in real time, and power indicated by an RSSI will not transit.

The RSSI calculation unit 207 is configured to obtain an RSSI value by calculation according to the amplification control signal and the second average power value.

In this embodiment, the RSSI calculation unit receives the amplification control signal from the amplification control unit 206 and the second average power value from the second power detection unit, performs correction on the second average power value according to a difference between the bandwidth of the first digital signal data stream and the bandwidth of the filtering channel, and obtains the RSSI value by calculation according to the amplification control signal and a corrected second average power value.

In this embodiment, it is assumed that the bandwidth of the first digital signal data stream is 200 M, that the bandwidth of the filtering channel of the filtering unit 203 is 20 M, and that the second average power value is 0.1 W. Then, the second average power value may be corrected to 1 W. It is assumed that the number of amplification times, indicated by the amplification control signal to the amplification unit, is 2, and then it can be obtained that the RSSI value is 0.5 W.

In this embodiment, an amplification unit receives a modulated signal data stream from a microwave transmit end and performs amplification on the modulated signal data stream according to an amplification control signal; an analog-to-digital conversion unit performs analog-to-digital conversion on the amplified modulated signal data stream to obtain a first digital signal data stream; a first power detection unit performs power detection on the first digital signal data stream to obtain a first average power value; and an amplification control unit obtains the amplification control signal according to the first average power value. In this embodiment, power detection required for an RSSI is separated from power detection required for amplification control, and power detection is performed directly on the first digital signal data stream; before that, filtering processing is not performed, that is, power detection is performed on all bandwidth of the first digital signal data stream; therefore, even if bandwidth switching occurs, the amplification control signal will not transit, which ensures power stability of a data stream that enters the analog-to-digital conversion unit, thereby reducing the possibility of bit errors and ensuring correct receipt of a service.

Embodiment 3

Figure 3:
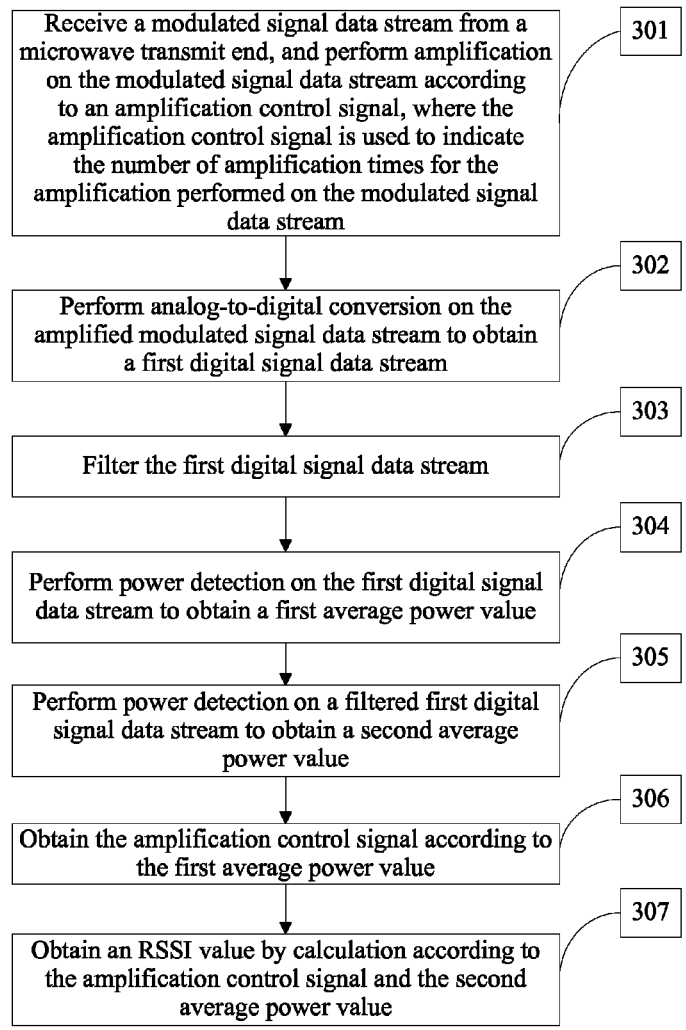
FIG. 3 shows a flowchart of an RSSI detection method according to a third embodiment of the present invention.

FIG. 3 shows a flowchart of an RSSI detection method according to a third embodiment of the present invention, where the method in this embodiment includes the following steps:

S301. Receive a modulated signal data stream from a microwave transmit end, and perform amplification on the modulated signal data stream according to an amplification control signal, where the amplification control signal is used to indicate the number of amplification times for the amplification performed on the modulated signal data stream.

S302. Perform analog-to-digital conversion on the amplified modulated signal data stream to obtain a first digital signal data stream.

S303. Filter the first digital signal data stream.

In this embodiment, bandwidth-matched filtering is performed on the first digital signal data stream, where bandwidth of the first digital signal data stream is the same as bandwidth of a filtering channel.

To implement the bandwidth-matched filtering, it is required to perform switching on the bandwidth of the filtering channel according to the bandwidth of the first digital signal data stream; in addition, when filtering is performed on the first digital signal data stream, it is required to ensure realtimeness of bandwidth switching of the filtering channel, and the bandwidth switching of the filtering channel is controlled by acquiring bandwidth information of the first digital signal data stream. Specifically, information that the bandwidth of the first digital signal data stream is going to change after a time T is acquired from the first digital signal data stream; a switching time t is calculated, and at a moment when the switching time t expires, switching is performed on the bandwidth of the filtering channel, where t=t1−t2, t1 is a delay from digital-to-analog conversion to acquisition of information from the first digital signal data stream, and t2 is a delay from digital-to-analog conversion to filtering; and then the bandwidth-matched filtering is performed on the first digital signal data stream by using a switch-to filtering channel.

In another embodiment, bandwidth-unmatched filtering may be performed on the first digital signal data stream, where the bandwidth of the first digital signal data stream is greater than the bandwidth of the filtering channel.

S304. Perform power detection on the first digital signal data stream to obtain a first average power value.

S305. Perform power detection on a filtered first digital signal data stream to obtain a second average power value.

S306. Obtain the amplification control signal according to the first average power value.

S307. Obtain an RSSI value by calculation according to the amplification control signal and the second average power value.

In step S303, when the bandwidth-matched filtering is performed on the first digital signal data stream, the RSSI value may be obtained by calculation directly according to the amplification control signal and the second average power value.

In step S303, when the bandwidth-unmatched filtering is performed on the first digital signal data stream, correction is performed on the second average power value according to a difference between the bandwidth of the first digital signal data stream and the bandwidth of the filtering channel, and the RSSI value is obtained by calculation according to the amplification control signal and a corrected second average power value.

In this embodiment, a modulated signal data stream is received from a microwave transmit end and amplification is performed on the modulated signal data stream according to an amplification control signal; analog-to-digital conversion is performed on the amplified modulated signal data stream to obtain a first digital signal data stream; power detection is performed on the first digital signal data stream to obtain a first average power value; and the amplification control signal is obtained according to the first average power value. In this embodiment, power detection required for an RSSI is separated from power detection required for amplification control, and power detection is performed directly on the first digital signal data stream; before that, filtering processing is not performed, that is, power detection is performed on all bandwidth of the first digital signal data stream; therefore, even if bandwidth switching occurs, the amplification control signal will not transit, which ensures power stability of a data stream that enters the analog-to-digital conversion unit, thereby reducing the possibility of bit errors and ensuring correct receipt of a service.

A person of ordinary skill in the art may understand that all or a part of the steps of the methods in the embodiments may be implemented by a program instructing relevant hardware. The program may be stored in a computer readable storage medium, such as a ROM, a RAM, a magnetic disc, or an optical disc.

The foregoing descriptions are merely exemplary embodiments of the present invention, but are not intended to limit the present invention. Any modification, equivalent replacement, or improvement made without departing from the spirit and principle of the present invention should fall within the protection scope of the present invention.

What is claimed is:

1. An apparatus for detecting a received signal strength indicator (RSSI), the apparatus comprising:

an amplification unit configured to receive a modulated signal data stream from a microwave transmit end, perform an amplification on the modulated signal data stream according to an amplification control signal, and send the amplified modulated signal data stream to an analog-to-digital conversion unit, wherein the amplification control signal indicates a number of amplification times for the amplification performed by the amplification unit on the modulated signal data stream;

the analog-to-digital conversion unit configured to perform an analog-to-digital conversion on the amplified modulated signal data stream to obtain a first digital signal data stream and send the first digital signal data stream to a filtering unit, to a first power detection unit and to a bandwidth information extraction unit;

the filtering unit configured to filter the first digital signal data stream and send a filtered first digital signal data stream to a second power detection unit;

the bandwidth information extraction unit configured to acquire, from the first digital signal data stream, information that a bandwidth of the first digital signal data stream is going to change after a time T and notify a delay alignment unit;

the delay alignment unit configured to calculate a switching time t, and at a moment when the switching time t expires, notify the filtering unit to perform switching on a bandwidth of a filtering channel;

the first power detection unit configured to perform a power detection on the first digital signal data stream to obtain a first average power value and send the first average power value to an amplification control unit;

the second power detection unit configured to perform a power detection on the filtered first digital signal data stream to obtain a second average power value and send the second average power value to a RSSI calculation unit;

the amplification control unit configured to obtain the amplification control signal according to the first average power value and send the amplification control signal to the RSSI calculation unit and the amplification unit; and an RSSI calculation unit configured to obtain an RSSI value by a calculation according to the amplification control signal and the second average power value.

2. The apparatus according to claim 1, wherein the bandwidth of the filtering channel of the filtering unit is the same as the bandwidth of the first digital signal data stream.

3. The apparatus according to claim 2:
wherein t=t1−t2, wherein t1 is a delay from a digital-to-analog conversion to an acquisition of information from the first digital signal data stream, and wherein t2 is a delay from a digital-to-analog conversion to a filtering.

4. The apparatus according to claim 3, wherein the filtering unit is a digital filter bank, and the switching performed by the filtering unit on the bandwidth of the filtering channel is completed by adjusting a coefficient of the digital filter bank.

5. The apparatus according to claim 1, wherein the bandwidth of the filtering channel of the filtering unit is less than the bandwidth of the first digital signal data stream.

6. The apparatus according to claim 5, wherein the RSSI calculation unit is further configured to perform a correction on the second average power value according to a difference between the bandwidth of the first digital signal data stream and the bandwidth of the filtering channel and obtain the RSSI value by the calculation according to the amplification control signal and a corrected second average power value.

7. A method for detecting RSSI, the method comprising:
receiving a modulated signal data stream from a microwave transmit end;

performing an amplification on the modulated signal data stream according to an amplification control signal, wherein the amplification control signal is used to indicate a number of amplification times for the amplification performed on the modulated signal data stream;

performing an analog-to-digital conversion on the amplified modulated signal data stream to obtain a first digital signal data stream;

filtering the first digital signal data stream;

acquiring, from the first digital signal data stream, information that a bandwidth of the first digital signal data stream is going to change after a time T;

calculating a switching time t, and at a moment when the switching time t expires;

performing switching on a bandwidth of a filtering channel, performing a power detection on the first digital signal data stream to obtain a first average power value;

performing a power detection on the filtered first digital signal data stream to obtain a second average power value;

obtaining the amplification control signal according to the first average power value; and obtaining an RSSI value by a calculation according to the amplification control signal and the second average power value.

8. The method according to claim 7, wherein filtering the first digital signal data stream specifically comprises performing bandwidth-matched filtering on the first digital signal data stream, wherein the bandwidth of the first digital signal data stream is the same as the bandwidth of the filtering channel.

9. The method according to claim 8, further comprising performing the bandwidth-matched filtering on the first digital signal data stream by using a switch-to the filtering channel,
wherein t=t1−t2, wherein t1 is a delay from a digital-to-analog conversion to an acquisition of information from the first digital signal data stream, and wherein t2 is a delay from the digital-to-analog conversion to a filtering.

10. The method according to claim 7, wherein filtering the first digital signal data stream specifically comprises performing bandwidth-unmatched filtering on the first digital signal data stream, wherein the bandwidth of the first digital signal data stream is greater than the bandwidth of the filtering channel.

11. The method according to claim 10, wherein obtaining the RSSI value by the calculation according to the amplification control signal and the second average power value comprises performing correction on the second average power value according to a difference between the bandwidth of the first digital signal data stream and the bandwidth of the filtering channel and obtaining the RSSI value by the calculation according to the amplification control signal and a corrected second average power value.

* * * * *